United States Patent
Hirler et al.

(10) Patent No.: US 7,750,397 B2
(45) Date of Patent: Jul. 6, 2010

(54) SEMICONDUCTOR COMPONENT INCLUDING COMPENSATION ZONES AND DISCHARGE STRUCTURES FOR THE COMPENSATION ZONES

(75) Inventors: Franz Hirler, Isen (DE); Ralf Siemieniec, Villach (AT); Ilja Pawel, Villach (AT)

(73) Assignee: Infineon Technologies Austria AG, Villach (AT)

( * ) Notice: Subject to any disclaimer, the term of this patent is extended or adjusted under 35 U.S.C. 154(b) by 208 days.

(21) Appl. No.: 12/105,810

(22) Filed: Apr. 18, 2008

(65) Prior Publication Data

US 2008/0258208 A1 Oct. 23, 2008

(30) Foreign Application Priority Data

Apr. 19, 2007 (DE) .................. 10 2007 018 631

(51) Int. Cl.
*H01L 23/62* (2006.01)
(52) U.S. Cl. .................. 257/328; 257/335; 438/212
(58) Field of Classification Search .................. 257/328, 257/335; 438/212
See application file for complete search history.

(56) References Cited

U.S. PATENT DOCUMENTS

| 4,941,026 | A | 7/1990 | Temple |
| 6,762,455 | B2 | 7/2004 | Oppermann et al. |
| 7,605,427 | B2 | 10/2009 | Hirler |

FOREIGN PATENT DOCUMENTS

| DE | 19815907 C1 | 5/1999 |
| DE | 100 07 415 A1 | 9/2001 |
| DE | 102005048447 A1 | 4/2007 |

OTHER PUBLICATIONS

G. Deboy et al., "A new generation of high voltage MOSFETs breaks the limit line of silicon", IEDM 98-683-685, Date 1998.
J. Roig et al., "Electrical and Physical Characterization of 150-200V FLYMOSFETs" (7 pages).
S. Alves et al., "Technical realization of low on-resistance FLYMOS™ transistors dedicated to automotive applications" (10 pages).
"A New Generation of Power Unipolar Devices: the Concept of the Floating Islands MOS Transistor", F. Cezac, et al., LAAS-CNRS, 2000, (4 pgs.).

*Primary Examiner*—Douglas M Menz
(74) *Attorney, Agent, or Firm*—Dicke, Billig & Czaja, PLLC

(57) ABSTRACT

A semiconductor component including compensation zones and discharge structures for the compensation zones. One embodiment provides a drift zone of a first conduction type, at least one compensation zone of a second conduction type, complementary to the first conduction type, the at least one compensation zone being arranged in the drift zone, at least one discharge structure which is arranged between the at least one compensation zone and a section of the drift zone that surrounds the compensation zone or in the compensation zone and designed to enable a charge carrier exchange between the compensation zone and the drift zone if a potential difference between an electrical potential of the compensation zone and an electrical potential of the section of the drift zone that surrounds the compensation zone is greater than a threshold value predetermined by the construction and/or the positioning of the discharge structure.

25 Claims, 6 Drawing Sheets

SEMICONDUCTOR COMPONENT INCLUDING COMPENSATION ZONES AND DISCHARGE STRUCTURES FOR THE COMPENSATION ZONES

CROSS-REFERENCE TO RELATED APPLICATIONS

This Utility Patent Application claims priority to German Patent Application No. DE 10 2007 018 631.4-33, filed on Apr. 19, 2007, which is incorporated herein by reference.

BACKGROUND

The present invention relates to a semiconductor component including a drift zone and including at least one compensation zone.

Components including a compensation zone arranged in the drift zone are also referred to as compensation components. In these components, in the off-state, that is to say when a space charge zone propagates in the drift zone, a part of the dopant charge present in the drift zone is compensated for by a dopant charge of the compensation zone. For the same dielectric strength, this permits a higher doping of the drift zone, and hence a lower on resistance than in components without compensation zones.

In compensation components, when a component is driven in the off-state and when there is a space charge zone propagating in the drift zone as a result, a charge carrier exchange occurs between the compensation zones and the surrounding drift zone, whereby the compensation zones are charged. If the component is subsequently driven in the on-state, then the charge stored in the compensation zones initially brings about a reduction of the current flow in the drift zone until the charge has flowed away, which results overall in switching delays. A pn-junction between the compensation zones and the drift zone is reverse-biased when the component undergoes transition from the off-state to the on-state, such that, in the case of compensation zones arranged in floating fashion, the compensation zones can only be discharged by using leakage currents, which takes a correspondingly long time.

In compensation components including column-type compensation zones, which are directly connected to the body zone, the dopant doses of the drift zone and of the compensation zones have to be coordinated very well with one another. This is complicated in the production of the components and can be ensured only with difficulty in the context of increasing miniaturization of the component structures.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

A semiconductor component in accordance with one embodiment includes a drift zone of a first conduction type, at least one compensation zone of a second conduction type, which is complimentary to the first conduction type, the at least one compensation zone being arranged in the drift zone, and a discharge structure arranged between the at least one compensation zone and a section of the drift zone that surrounds the compensation zone or in the compensation zone. The discharge structure is designed to enable a charge carrier exchange between the compensation zone and the drift zone if a potential difference between an electrical potential of the compensation zone and an electrical potential of the section of the drift zone that surrounds the compensation zone is greater than a threshold value predetermined by the construction and/or the positioning of the discharge structure. In this case, the threshold value can also be zero.

Figure 1:
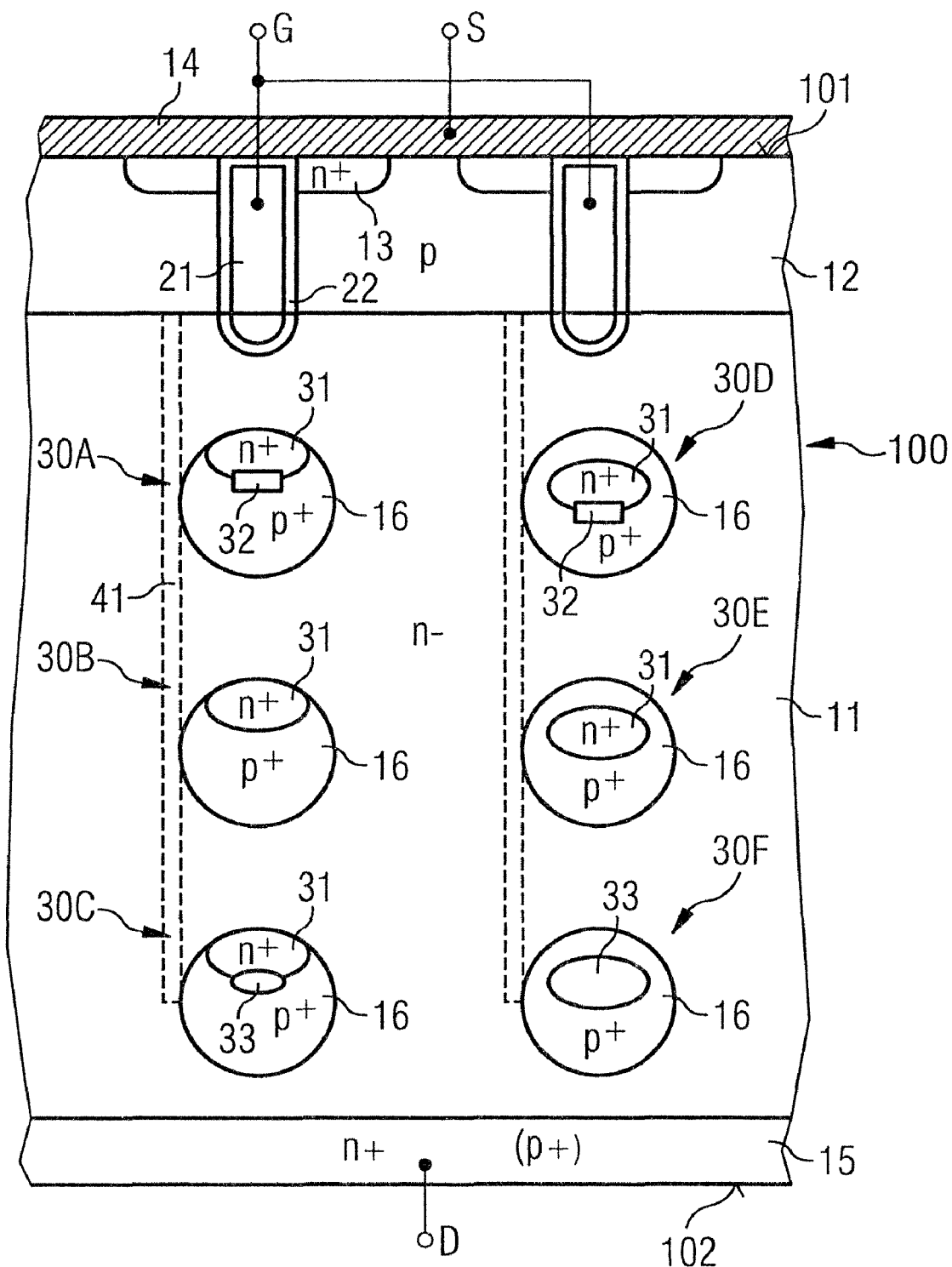
FIG. 1 illustrates an excerpt from a semiconductor component embodied as a trench MOSFET in cross section.

FIG. 1 illustrates an excerpt from a semiconductor component in accordance with one embodiment in cross section.

The component illustrated is realized as a trench transistor and has a semiconductor body 100 having a drift zone 11 of a first conduction type, the drift zone being arranged in the semiconductor body 100, and a plurality of compensation zones 16 of a second conduction type, which is complementary to the first conduction type, the compensation zones being arranged in the drift zone 11.

The component illustrated is n-conducting, and the drift zone 11 is therefore n-doped, while the compensation zones 16 are p-doped. It should be pointed out in this connection that these doping types should be understood merely as an example and that the drift zone can also be p-doped, of course, and the compensation zones can also be n-doped. In this case, the doping types of the further component zones of the semiconductor component that will be explained below should be correspondingly interchanged.

Adjacent to the drift zone 11 is a complementarily doped body zone 12, which together with the drift zone 11 forms a pn-junction proceeding from which a space charge zone can propagate in the drift zone 11 upon application of a reverse voltage in a manner yet to be explained. The body zone 12 is arranged between the drift zone 11 and a source zone 13 doped complementarily to the body zone 12, contact being made with the source zone by a source electrode 14. The source electrode 14 can short-circuit the body zone 12 and the source zone 13 in a manner known in principle (as illustrated), but can also be realized in such a way that it only makes contact with the source zone 13.

A gate electrode 21 is present for controlling a conducting channel in the body zone 12 between the source zone 13 and the drift zone 11, the gate electrode extending adjacent to the body zone 12 from the source zone 13 as far as the drift zone 11 and being dielectrically insulated from the body zone 12 by a gate dielectric 22.

The MOS transistor illustrated is realized as a normally off transistor and has a body zone 12 doped complimentarily to the drift zone 11 and the source zone 13. The channel controlled by the gate electrode 21 in the body zone 12 is an inversion channel in this case. However, the invention is not restricted to normally off MOS transistors, but rather could also be applied correspondingly to normally on transistors. Such a normally on transistor would be obtained for example if, in the case of the MOS transistor illustrated in FIG. 1, an n-doped semiconductor zone were provided between the source zone 13 and the drift zone 11 along the gate dielectric 22.

The component illustrated in FIG. 1 is constructed in cellular fashion and has a multiplicity of component structures of identical type—transistor cells—each having a source zone 13 and a gate electrode 21, contact being made with the source zones 13 jointly by the source electrode 14 and contact being made with the gate electrodes 21 jointly. In the case of the component embodied as a trench transistor, the gate electrodes 21 are arranged in trenches extending into the semiconductor body 100 proceeding from a front side 101. The individual transistor cells can be realized as strip cells, for example. The gate electrodes 21 and the source zones 13 then extend in strip-type fashion in a direction perpendicular to the plane of the drawing illustrated in FIG. 1. It goes without saying that it is also possible to use any further cell structures such as square or hexagonal cells, for example, in which the gate electrodes have a square or hexagonal geometry in a horizontal direction of the semiconductor body (not illustrated).

A drain zone 15 is adjacent to a side of the drift zone 11 that is remote from the body zone 12, the drain zone being doped more highly than the drift zone 11 and being doped by the same conduction type as the drift zone 11 in the case of a MOSFET and being doped complementarily to the drift zone 11 in the case of an IGBT. The doping indication between parentheses in FIG. 1 relates to an IGBT. It should be pointed out in this connection that the drain zone is also referred to as emitter zone in the case of an IGBT.

The illustrated component realized as an n-conducting MOSFET is turned on if a positive voltage is present between the drain zone 15 and the source zone 13 and if an electrical potential suitable for forming an inversion channel in the body zone 12 is present at the gate electrode 21. This suitable driving potential is a positive electrical potential with respect to source potential in the case of an n-conducting normally off MOSFET. The on-resistance, that is to say the electrical resistance between the source terminal S and the drain terminal D, is crucially influenced in this case by the dimensions of the drift zone 11 between the body zone 12 and the drain zone 15 and also by the doping concentration of the drift zone 11. The dimensions of the drift zone 11 between the body zone 12 and the drain zone 15 are dependent on the desired dielectric strength of the component. As a rule of thumb it holds true here that the dimensions of the drift zone per 100 volts of desired dielectric strength are 6 to 10 µm. The doping concentration of the drift zone lies for example within the range of $1 \cdot 10^{13}$ cm$^{-3}$ to $5 \cdot 10^{17}$ cm$^{-3}$, in one embodiment within the range of $1 \cdot 10^{15}$ cm$^{-3}$ to $1 \cdot 10^{17}$ cm$^{-3}$.

If the component is turned off by interruption of the inversion channel between the source zone 13 and the drift zone 11 through suitable driving of the gate electrode 21, then a space charge zone propagates in the drift zone 11 in the direction of the drain zone 15 proceeding from the pn-junction between the body zone 12 and the drift zone 11. Owing to the space charge zone, the electrical potential rises in the drift zone 11 proceeding from the source potential directly at the pn-junction, with increasing distance from the pn-junction, up to the drain potential, which can be as much as a few 100 volts. In this component, space charge zones also propagate in the off-state case proceeding from the pn-junctions between the compensation zones 16 and the drift zone 11, whereby the drift zone can be doped more highly than in components without such compensation zones. A consequence of these space charge zones propagating in the off-state case is positively charged donor cores in the drift zone 11 and negatively charged acceptor cores in the compensation zones 16. The negatively charged acceptor cores result from holes flowing away from the compensation zones 16 or electrons flowing into the compensation zones 16 in the off-state.

If the component is subsequently driven in the on-state again, then the electrical potential of the drift zone 11 decreases with respect to the electrical potential present in the off-state. The pn-junctions between the negatively charged compensation zones 16 and the drift zone 11 are then reverse-biased, whereby the electrical charge stored in the compensation zones 16 cannot be compensated for by holes flowing in via the pn-junctions. This electrical charge still present in the compensation zones after the component has been driven in the on-state would adversely influence the conduction behavior of the drift zone 11 if no additional measures were taken. Thus, the voltage dropped across the switched-on component at nominal current would be for example 10 to 50 times the voltage which occurs in the case of discharged compensation zones.

In order, upon transition from the off-state to the on-state of the component, to achieve a rapid discharge of the electrical charge that is initially still stored in the compensation zones 16, the component has discharge structures which are arranged between the compensation zones 16 and the sections of the drift zone 11 that surround the compensation zones 16 or which are arranged within the compensation zones 16. For the sake of clarity, six different discharge structures 30A-30F of this type are illustrated jointly in the component in FIG. 1. It should be pointed out in this connection that within a component different discharge structures can be provided with respect to the individual compensation zones, but that it is also possible for only one type of discharge structure to be used.

Owing to a potential difference between the electrical potential of the compensation zones 16 and the electrical potential of the drift zone 11 upon transition from the off-state to the on-state of the component, that is to say upon switch-on, space charge zones propagate around the compensation zones 16 and within the compensation zones 16. In this case, the discharge structures are realized in such a way that they inject charge carriers, electrons in the example, into the drift zone 11 if the space charge zone encroaches on them. By using a suitable coupling yet to be explained between the discharge structures and the compensation zones 16, holes are simultaneously injected into the compensation zones 16, the holes discharging the compensation zones.

A discharge structure 30A in accordance with one embodiment includes a discharge zone 31, which is doped complementarily to the compensation zone 16 and more highly than the drift zone 11 and which can also be doped more highly than the compensation zone 16 and which is arranged between the compensation zone 16 and a section of the drift zone 11 that surrounds the compensation zone 16. An ohmic contact is present between the discharge zone 31 and the compensation zone 16, the ohmic contact being formed by an electrically conductive component zone 32 arranged between the zones 31, 16. The electrically conductive component zone 32 is composed for example of a metal or a silicide. In the case of the first discharge structure 30A illustrated in FIG. 1, the discharge zone 31 is arranged at a side of the compensation zone 16 that is remote from the drain zone 15 or faces the body zone 12. This first discharge structure 30A including the discharge zone 31 and the contact zone 32 discharges the compensation zone 16, when the component is switched on, to an electrical potential that corresponds approximately to the electrical potential of the drift zone 11 at an end facing the body zone 12 (the upper end in the figure). When the component is switched on, from the discharge zone 31 electrons are injected into the drift zone 11 and at the same time holes are injected into the compensation zone 16, which discharge the compensation zone 16.

In the case of the n-conducting component illustrated, in which the source zone 13 and the body zone 12 are at a lower electrical potential than the drain zone 15 during operation, for each of the compensation zones 16 the electrical potential in the drift zone 11 at the upper end of the compensation zones 16 is lower than that in remaining regions of the drift zone 11 that surround the compensation zones 16. This holds true both in the on-state and in the off-state of the component, in which case the potentials, as seen in absolute terms, are significantly higher when the component is in the off-state than when the component is in the on-state. In the off-state case, the compensation zone 16 "shields" the discharge zone 31 from the electrical potentials that increase in a direction of the drain zone 15, thereby preventing the space charge zone that propagates in the off-state case from encroaching on the discharge zone 31. In the case of the discharge structure 30A and the discharge structure 30C yet to be explained, leakage currents generated in the discharge zone 31 are kept small as a result of this. In the case of the discharge structures, a threshold voltage to be overcome before a charge carrier injection into the drift zone or the compensation zones 16 commences is approximately zero. In the case of the remaining discharge structures 30B, 30D-30F yet to be explained, the threshold voltage is greater than zero. Static leakage currents do not occur in the remaining structures.

A second discharge structure 30B illustrated in FIG. 1 differs from the first discharge structure 30A by virtue of the fact that the discharge zone 31 directly adjoins the compensation zone 16, that is to say that there is no ohmic contact present between the discharge zone 31 and the compensation zone 16. The compensation zone 16 and the discharge zone 31 form a zener diode in the case of this discharge structure. In the case of this discharge structure, the compensation zone 16 is discharged upon transition from the off-state to the on-state to an electrical potential whose absolute value differs from the electrical potential in the drift zone 11 at the upper end of the compensation zone 16 by the value of a zener voltage of the zener diode. In this case, the compensation zone 16 cannot be discharged completely or can be discharged only to a smaller extent than in the case of the first discharge structure 30A. In this case, an injection of charge carriers into the compensation zone 16 commences only when a voltage difference between the drift zone section at a side of the compensation zone 16 that faces the body zone 12 and the compensation zone 16 is greater than a zener voltage of the zener diode formed by the compensation zone 16 and the discharge zone 31.

In one embodiment of a discharge structure 30C, a generation region 33 is arranged between the discharge zone 31 and the compensation zone 16. The generation region 33 has local generation centers in the form of crystal defects or impurity atoms or is composed for example of an amorphous or polycrystalline semiconductor material and has a high charge carrier generation rate. From the charge carrier pairs generated, the holes flow into the compensation zone 16 in order to discharge the latter, whilst the electrons flow away via the discharge zone 31 into the drift zone 11.

The robustness of the discharge structures explained with respect to the generation of leakage currents can be increased by arranging the discharge structures completely within the compensation zones 16. In FIG. 1, the reference symbol 30D designates a fourth discharge structure, which has a discharge zone 31 and an ohmic contact zone 32 in accordance with the first discharge structure 30A, but which is arranged completely within the compensation zone 16.

In this case, the discharge zone 31 lies nearer to an upper end of the compensation zone 16 than to a lower end, that is to say lies nearer to the point of lowest electrical potential of the drift zone 11, lying at the upper end of the compensation zone 16. The functioning of the fourth discharge structure 30D differs from the functioning of the first discharge structure 30A in that a discharge of the compensation zone 16 commences only when a potential difference between the compensation zone 16 and the drift zone 11 at the upper end of the compensation zone 16 is large enough for a field punch-through to commence in that section of the compensation zone 16 which separates the drift zone 11 and the discharge zone 21 (punch-through effect). In this case, the distance between the discharge zone 31 and the drift zone 11 influences the threshold voltage to be overcome at which a charge carrier injection commences, the voltage increasing as the distance increases.

In a corresponding manner, it is also possible to provide a discharge zone 31 without an ohmic contact zone within the compensation zone 16, which is illustrated in FIG. 1 for a fifth discharge structure designated by the reference symbol 30E. In the case of this discharge structure, in addition to the punch-through voltage there is also the zener voltage that has to be overcome for a discharge of the compensation zone 16.

In a corresponding manner, a generator zone 33 completely surrounded by the compensation zone 16 can also be provided as discharge structure, as is illustrated in FIG. 1 for a sixth discharge structure designated by the reference symbol 30F. In contrast to the third discharge structure 30C, the sixth discharge structure 30F does not contain an additional discharge zone. The generator zone 33, in a manner corresponding to the discharge zones 31, 33 of the discharge structures 30D, 30E is arranged nearer to the upper end of the compensation zone 16 than to the lower end, that is to say arranged nearer to the point of lowest electrical voltage of the drift zone 30.

What is common to the discharge structures explained is that when the component is switched on, they—at least partly—discharge the compensation zones 16 when a potential difference between the compensation zone 16 and the surrounding drift zone 11 is greater than a threshold value dependent on the construction of the discharge structure and the positioning thereof with respect to the compensation zone. In the case of the discharge structures 30A and 30B, however, the threshold value tends towards zero.

There is optionally the possibility of providing, in addition to the discharge structures, semiconductor zones 41 (illustrated by dashed lines) which are doped complementarily to the drift zone 11, which are arranged between the compensation zones 16 and the body zones 12, and which support a rapid depletion of the compensation zones 16 upon transition from the on-state to the off-state of the component. The doping of the semiconductor zones 41 is chosen in such a way that they can be fully depleted when the component is in the off-state. For this purpose, the doping concentration of the semiconductor zones 41 is in one embodiment lower than the doping concentration of the compensation zones 16. The compensation zones can be fully depleted when the semiconductor zones 41 are provided. In the case of voltage differences above the threshold value explained previously, in this case the discharge structures 30A-30F act to bring about the discharge of the compensation zones, and, at voltages below the threshold voltage, the semiconductor zones 41 act to bring about discharge.

Figure 2:
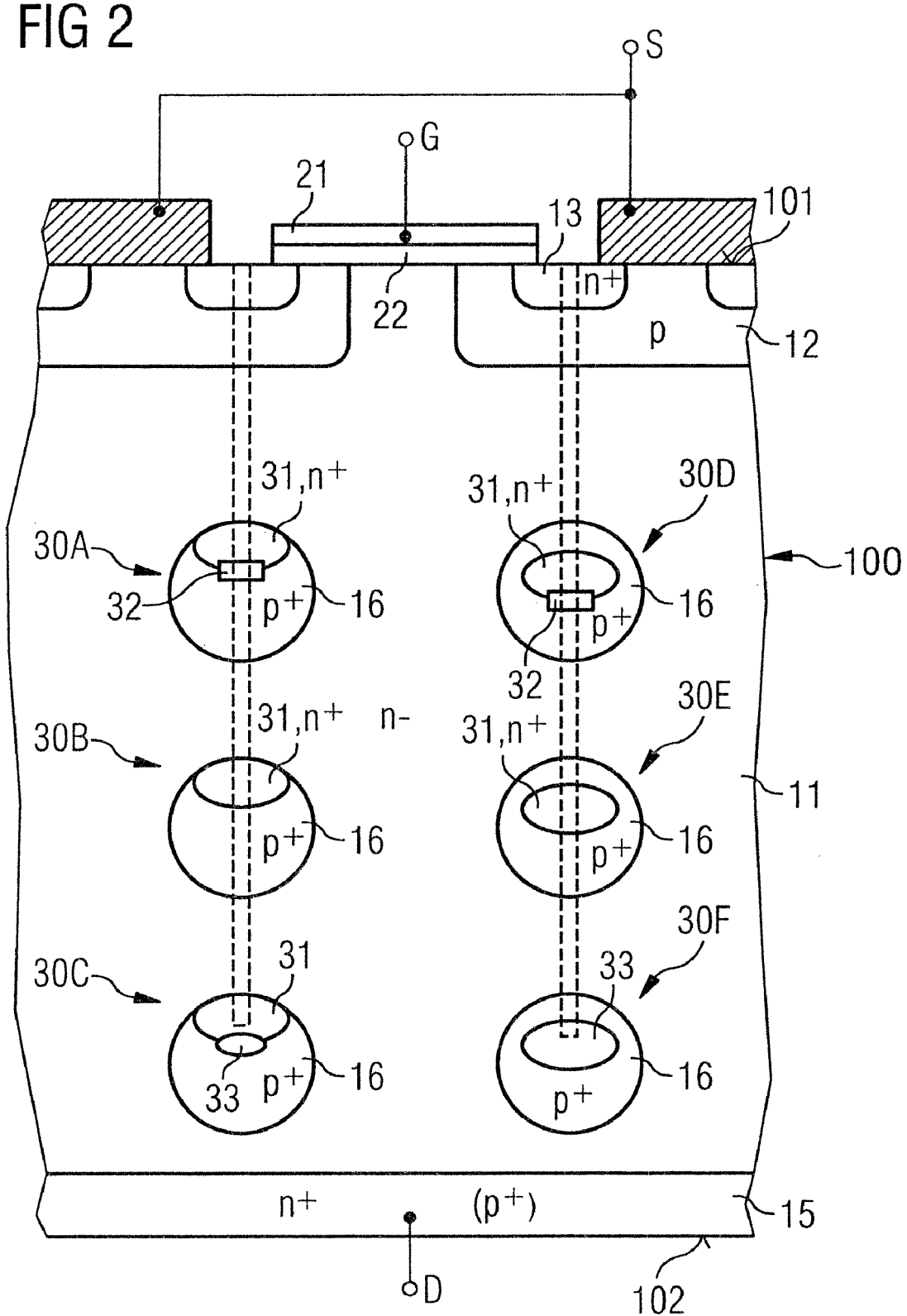
FIG. 2 illustrates an excerpt from a semiconductor component embodied as a planar MOSFET in cross section.

It goes without saying that the provision of compensation zones 16 with discharge structures 30A-30F in a drift zone 11 is not restricted to trench transistors, but rather can be applied to any power components. FIG. 2 illustrates in cross section an excerpt from a power semiconductor component embodied as a planar MOSFET or planar IGBT. In the case of this component, the gate electrode 21 is arranged above the front side 101 of the semiconductor body. In the case of this component, an inversion channel propagates in a lateral direction of the semiconductor body between the source zone 13 and a section of the drift zone 11 that extends as far as the front side 101.

Figure 3:
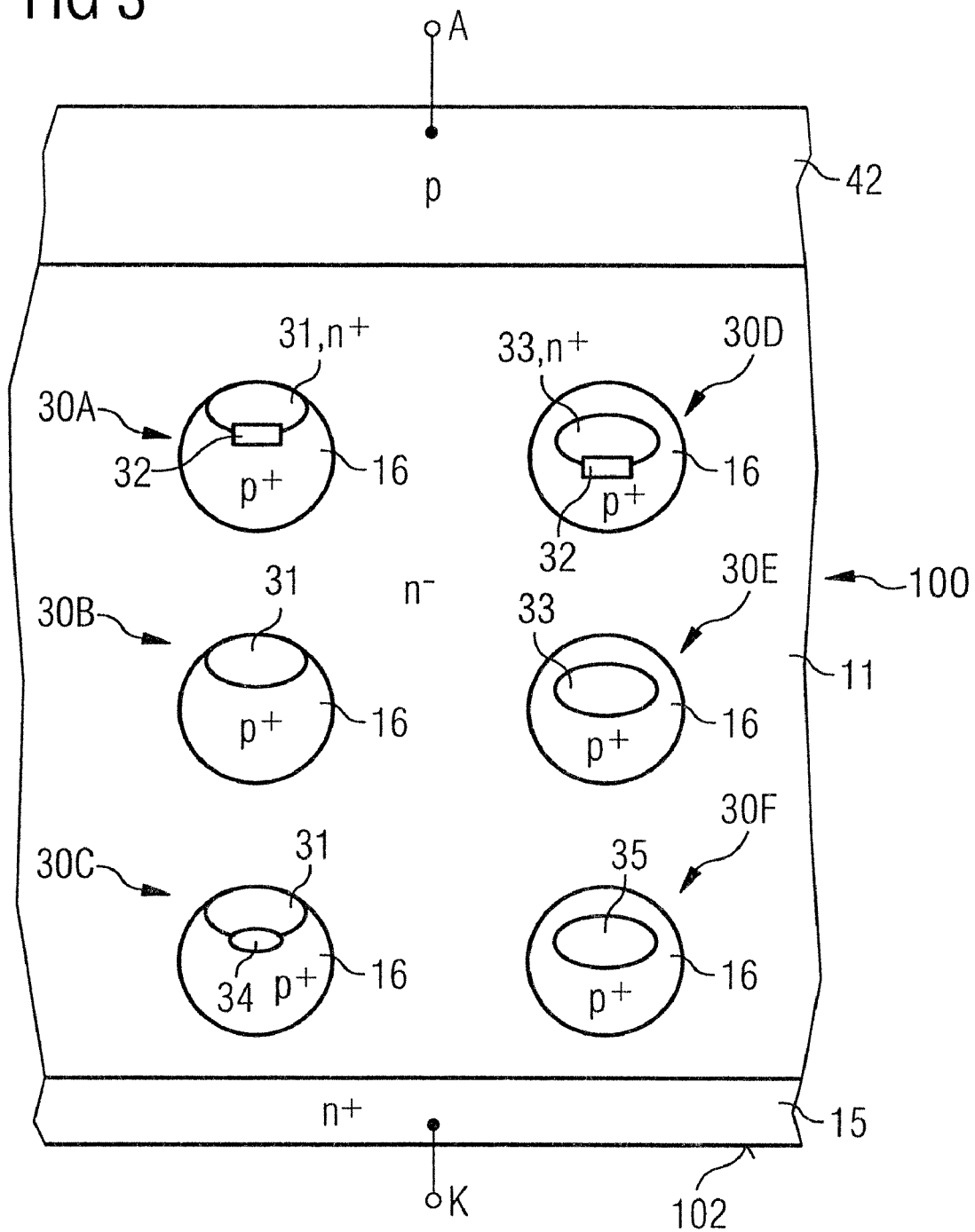
FIG. 3 illustrates an excerpt from a semiconductor component embodied as a diode in cross section.

Referring to FIG. 3, the provision of compensation zones 16 with discharge structures in a drift zone 11 can, of course, also be applied to power diodes or p-n n-diodes. FIG. 3 illustrates an excerpt from such a diode in cross section. Instead of a cellular structure with source and body zones and gate electrodes, as in a MOS transistor, in this diode there is adjacent to the drift zone 11 a component zone 42 doped complementarily to the drift zone 11, the component zone forming a p-type emitter or an anode zone of the diode. A semiconductor zone 15, which is adjacent to the drift zone 11 at the side opposite to the anode zone and is of the same conduction type as the drift zone 11, forms an n-type emitter zone or cathode zone in this diode.

The concept explained of providing compensation zones with discharge structure can also be applied to Schottky diodes, in a manner not illustrated in greater detail. Such a Schottky diode differs from the bipolar diode illustrated in FIG. 3 in that a Schottky metal zone is present instead of a semiconductor zone which is adjacent to the drift zone and which is doped complementarily to the drift zone.

In the case of the semiconductor components explained above, the semiconductor body 100 includes a semiconductor substrate, for example, which forms the drain zone of the MOS transistors explained above or the cathode zone of the diode explained above. The drift zone 11 is an epitaxial layer, for example, which is produced by epitaxial deposition onto the semiconductor substrate. The compensation zones and the discharge structures of the components explained with reference to FIGS. 1 to 3 can be produced during the production of the epitaxial layer forming the drift zone 11. A number of thin semiconductor layers are produced successively during the epitaxial growth. In each case after the production of individual layers from among the semiconductor layers, dopant atoms can be implanted in masked fashion in this case in order to produce the compensation zones and the discharge structures. The generation zones (33 in FIGS. 1 to 3) can be produced for example by implanting dopant atoms or non-doping atoms such as, for example, silicon (Si), germanium (Ge), argon (Ar) with such a high dose that a local amorphization occurs. The amorphized zones thus produced then form the generation zones. It is equally possible to produce deep imperfections, for example by introducing platinum (Pt) or gold (Au).

The compensation zones 16 and the discharge structures can also be produced by virtue of the fact that after the deposition of the epitaxial layer, trenches are etched into the semiconductor body proceeding from the front side 101 of the semiconductor body and that dopant atoms are subsequently implanted into the semiconductor body via the bottoms of the trenches, the dopant atoms being chosen suitably in order to produce the compensation zones and the discharge structures. In order to produce compensation zones 16 and discharge structures at different vertical positions of the semiconductor body, the trench is either etched step by step proceeding from the front side 101, or is firstly etched down to a desired maximum depth and subsequently filled step by step with a filling material, for example a dielectric or crystalline semiconductor material.

In the case of the discharge structures 30A, 30D explained above, a short circuit between the discharge zone 31 and the compensation zone 16 is formed by an electrically conductive zone 32, the production of which within the semiconductor body 100 is complicated, however. In a manner not illustrated in greater detail, there is the possibility, therefore, of producing the compensation zone 16 and the discharge zone 31 in such a way that they extend in sections as far as the front side 101 of the semiconductor body 100 and are short-circuited by a short-circuit zone in the region of the front side 101. By way of example, in an edge region of the semiconductor body 100 in which a cell array is no longer present, the compensation zone 16 and the discharge zone 31 extend as far as the front side 101 (not illustrated). For this purpose, the compensation zone 16 and the discharge zone 31 are embodied in elongated fashion in a direction perpendicular to the plane of the drawing illustrated in FIG. 2 and then extend below the edge in a vertical direction.

Figure 4:
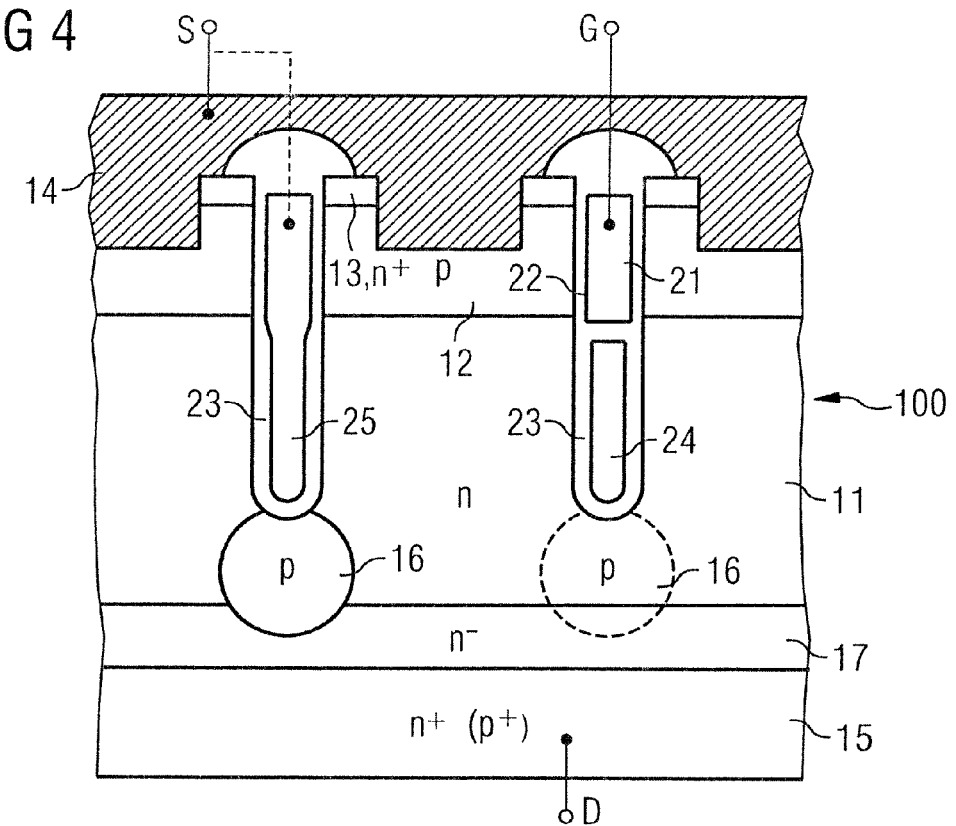
FIG. 4 illustrates in cross section an excerpt from a semiconductor component embodied as a trench MOSFET with a compensation zone arranged below a field electrode in a drift zone.

One embodiment realized as a MOSFET and including a compensation zone arranged in a drift zone is illustrated as an excerpt in cross section in FIG. 4. In the case of this component, the drift zone includes two differently doped drift zone sections 11, 17, of which a first drift zone section 11, which is adjacent to the body zone 12, is doped more highly than a second drift zone section 17, which is arranged between the first drift zone section 11 and the drain zone 15. The MOSFET illustrated is realized as a field plate transistor. In this case, field plates 24, 25 are arranged in the more highly doped drift zone section 11, the field plates being insulated from the drift zone 11 by a field plate dielectric 23 and being at source potential, for example. In the case of the trench transistor illustrated in FIG. 4, the field plates—as illustrated in the right-hand part of FIG. 4—can be provided in the same trench as the gate electrode 21, below the gate electrode 21. In this case, in a manner not illustrated in greater detail, the field electrode 24 is connected to the source electrode 14 in a component region situated at a distance from the sectional plane illustrated in FIG. 4. As is illustrated in the left-hand part of FIG. 4, the field plates 25 can also be realized in separate trenches and extend as far as the front side of the semiconductor body and be contact-connected there. Some or all of such field plates 25 can equally be connected to gate potential.

When the component is in the off-state, the field electrodes 24, 25 that are at source potential, for example, bring about a partial compensation of the dopant charge present in the more highly doped drift zone section 11, such that in the case of the field plate component in comparison with a component without a field plate and with the same doping of the drift zone, higher reverse voltages can be achieved, or that, given the same reverse voltage, higher dopings of the drift zone and hence lower on resistances are possible.

In the case of the component illustrated, compensation zones 16 are arranged in the drift zone below the trenches having only the field electrode and/or below the trenches having the gate electrode 21 and the field electrode 24. In a manner not illustrated in greater detail, the compensation zones 16 are connected to the drift zone 11 via discharge structures explained above. However, the compensation zones 16 can also be arranged in floating fashion, that is to say that the provision of the discharge structures explained can also be dispensed with.

In a manner already explained, in the off-state case of the component, the compensation zones 16 bring about a compensation of part of the dopant charge present in the drift zone 11, 17. Owing to the compensation zones 16, in the case of a desired dielectric strength of the component, the more highly doped drift zone section 11 can extend further in a direction of the drain zone 15 than in the case of a component without such compensation zones. A lower on resistance of the component is possible as a result of this.

When the component is in the off-state, the more highly doped drift zone section and the more lightly doped drift zone section each take up part of the reverse voltage present, the dimensions of the more lightly doped drift zone section 17 being chosen such that the latter has a dielectric strength corresponding to the difference between the desired dielectric strength of the component and the dielectric strength of the more highly doped drift zone section 11. When the component is in the on-state, the more lightly doped section, on account of its lower doping, contributes to the on resistance to a greater extent, however, than any correspondingly sized part of the more highly doped drift zone section 11. The doping concentration of the more highly doped drift zone section 11 is for example between two times and twenty times as high as the doping concentration in the more lightly doped drift zone section 17. In absolute terms the doping concentration lies between $5 \cdot 10^{15}$ cm$^{-3}$ and $1 \cdot 10^{17}$ cm$^{-3}$, and in one embodiment in the region of $2 \cdot 10^{16}$ cm$^{-3}$.

Figure 5:
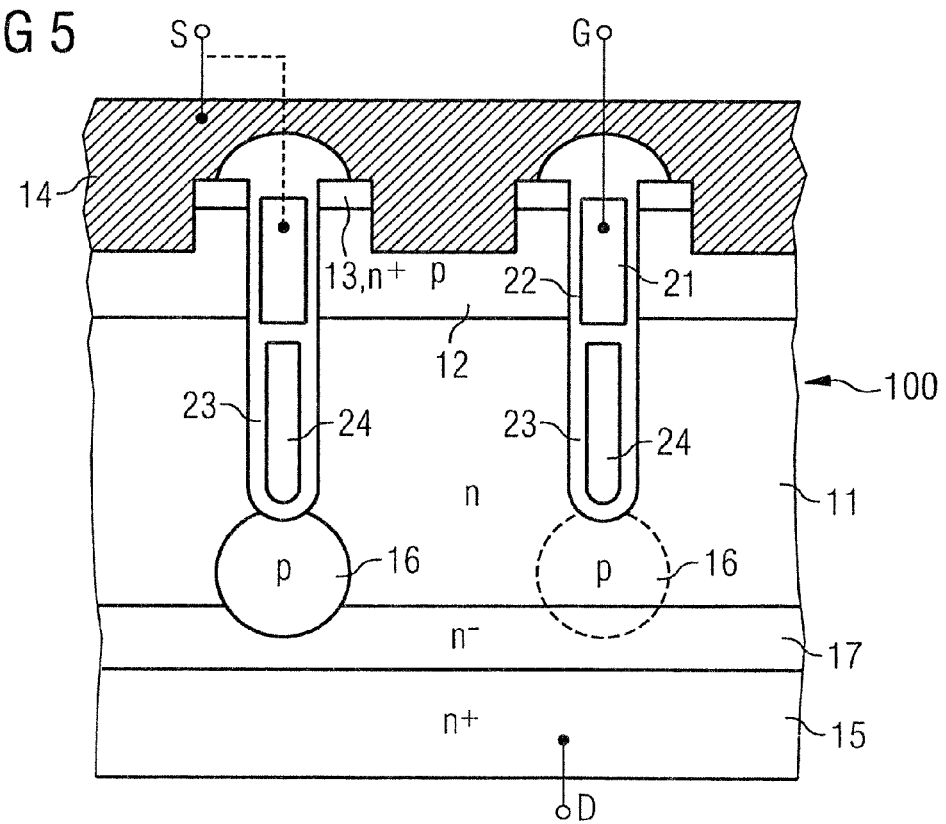
FIG. 5 illustrates in cross section an excerpt from a semiconductor component embodied as a MOSFET with a compensation zone arranged below a gate electrode of a drift zone.

FIG. 5 illustrates a modification of the component illustrated in FIG. 4, in which exclusively trenches having gate electrodes 21 and field electrodes 24 arranged underneath are present. In this case, the compensation zones 16 can be arranged under each of the trenches or else only under every n-th, wherein n>1, trench, as is illustrated by dashed lines in FIG. 5. The field electrodes 24 can for example be at gate potential or else at source potential.

In the case of the components illustrated in FIGS. 4 and 5, the compensation zones 16 are realized in such a way that they extend in a vertical direction of the semiconductor body 100 from the trenches having the field electrodes 23, 24 right into the more lightly doped drift zone section 17. The compensation zones 16 can be produced for example by virtue of the fact that after the etching of the trenches for the gate electrodes and the field electrodes, dopant atoms are implanted into the semiconductor body via the trenches before the field plate dielectrics and the gate dielectrics and also the field electrodes and the gate electrodes are actually produced in the trenches. A combination of field plates and of compensation zones for the compensation of dopant charge in the drift zone when the component is in the off-state affords the advantage over pure field plate components that trenches having a smaller depth for the field electrodes have to be produced. This is advantageous with regard to the mechanical loading of the semiconductor wafer during the production method since the trenches having the field electrode dielectric and the field electrodes arranged therein lead to an increasing mechanical strain of the semiconductor wafer as the trench depth increases.

Figure 6:
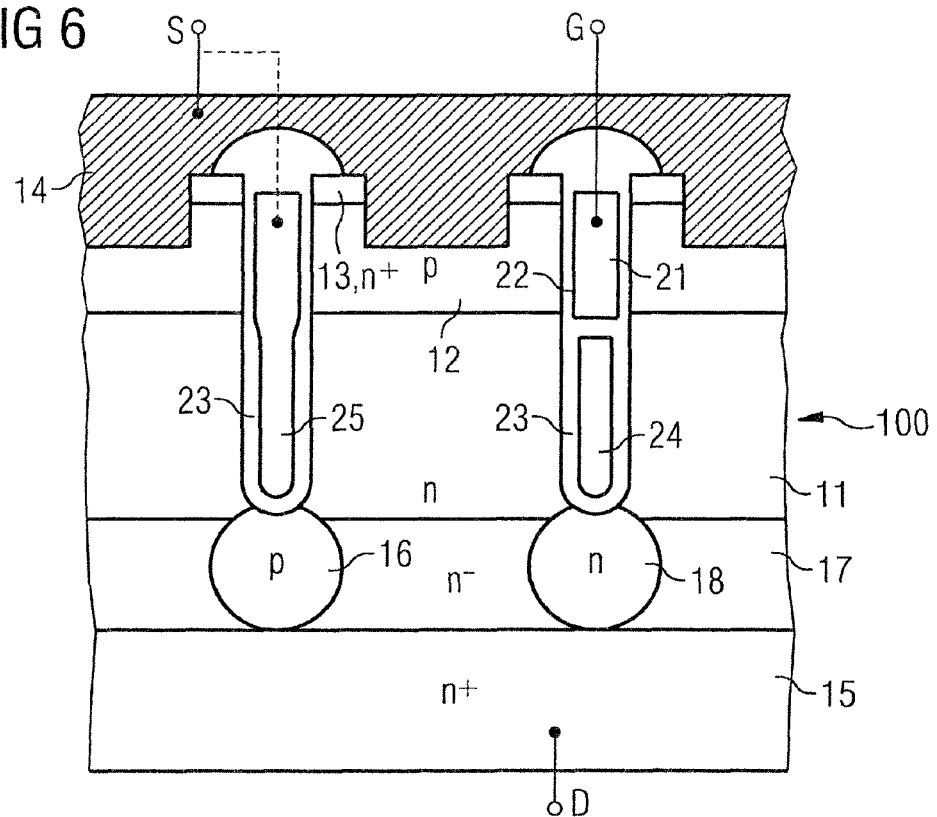
FIG. 6 illustrates in cross section an excerpt from a semiconductor component embodied as a MOSFET with a more weakly doped drift zone section, in which semiconductor zones doped complementarily to one another are arranged.
Figure 7:
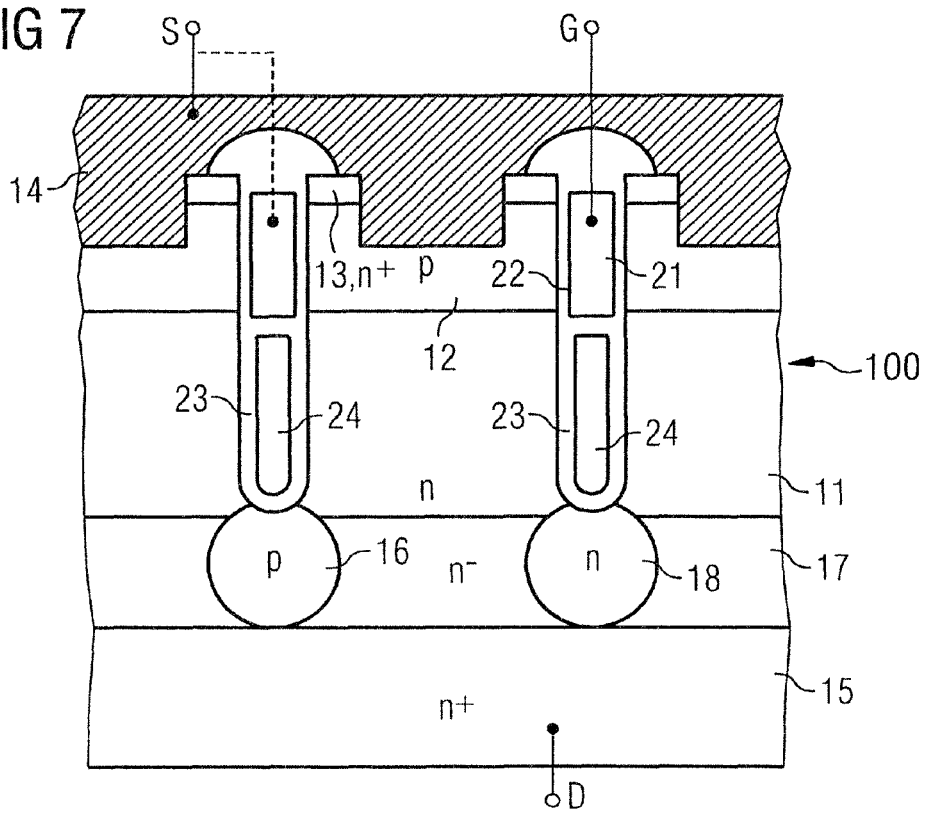
FIG. 7 illustrates a component modified with respect to the component in FIG. 6.

Variants of the components illustrated in FIGS. 4 and 5 are illustrated in FIGS. 6 and 7. In the case of these components, the more lightly doped drift zone section 17, proceeding from the drain zone 15, extends at least approximately as far as the trenches having the field electrodes. In the more lightly doped drift zone section 17, compensation zones 16 and further drift zone sections 18 are in this case arranged between the trenches and the drain zone 15, wherein the further drift zone sections 18 are doped more highly than the more lightly doped drift zone section 17 and, with regard to their doping concentration, can correspond for example to the doping concentration of the more highly doped drift zone section 11. The compensation zones 16 and the further drift zone sections 18 are arranged for example alternately below the trenches having the field electrodes. In the case of this component, the further drift zone sections 18 bring about a reduction of the on resistance in the more lightly doped drift zone section 17, when the compensation zones 16 serve to compensate for the dopant charge present in the further drift zone sections 18 in the off-state case. Therefore, the dopant charge present in the compensation zones 16 ideally corresponds to the dopant charge present in the further drift zone sections 18. The further drift zone sections 18 can be produced, in a manner corresponding to the compensation zones 16, after the production of the trenches for the field electrodes by implementation and/or indiffusion of dopant atoms via the bottoms of the trenches.

Figure 8:
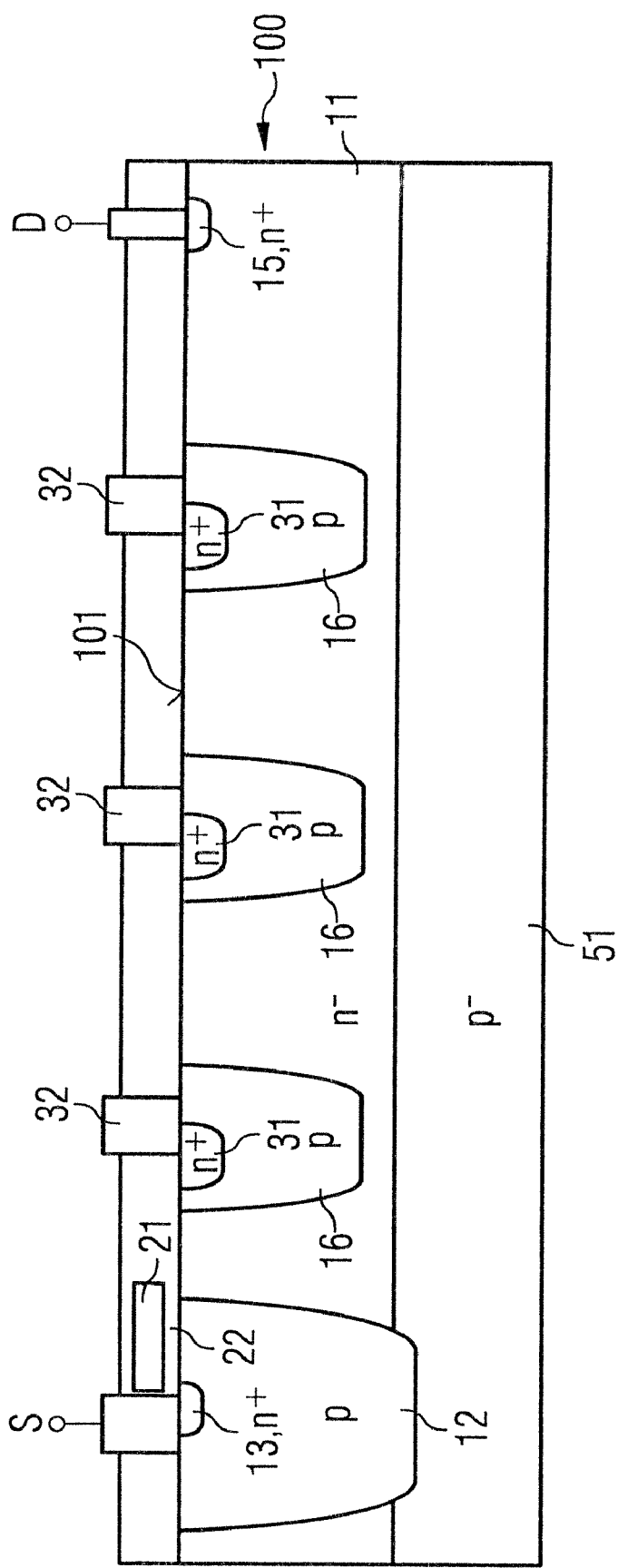
FIG. 8 illustrates a semiconductor component embodied as a lateral MOSFET.

Even though the embodiments explained above illustrate vertical components, that is to say components in which a current flow direction runs in a vertical direction of the semiconductor body and the drift zone 11 thus extends in a vertical direction of the semiconductor body 100, it goes without saying that the invention is not restricted to such vertical components, but rather can also be applied to lateral components. FIG. 8 illustrates one embodiment of a semiconductor component embodied as a lateral MOSFET. In this case, a body zone 12 and a drain zone 15 are arranged at a distance from one another in a lateral direction of the semiconductor body 100. Compensation zones 16 are arranged in a drift zone 11 arranged between the body zone 12 and the drain zone 15, a number of discharge structures being arranged in the compensation zones. The discharge structures correspond in terms of function and construction to the discharge structures 30D in accordance with FIGS. 1 and 2, but could also be replaced by any of the other discharge structures explained. In the case of the component in accordance with FIG. 8, short-circuit zones 32 for short-circuiting the compensation zones 16 and the discharge zones 31 are arranged above a front side 101 of the semiconductor body 100 and can thereby be realized in a simple manner. In the case of the component illustrated, the drift zone 11 is arranged above a semiconductor substrate 51 doped complementarily to the drift zone 11, in which case the body zone 12 can be connected to the substrate.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor component comprising:
    a drift zone of a first conduction type;
    at least one compensation zone of a second conduction type, complementary to the first conduction type, the at least one compensation zone being arranged in the drift zone; and
    at least one discharge structure which is arranged between the at least one compensation zone and a section of the drift zone that surrounds the compensation zone or in the compensation zone and which is designed to enable a charge carrier exchange between the compensation zone and the drift zone if a potential difference between an electrical potential of the compensation zone and an electrical potential of the section of the drift zone that surrounds the compensation zone is greater than a threshold value predetermined by the construction and/or the positioning of the discharge structure.

2. The semiconductor component of claim 1, comprising wherein the discharge structure has a discharge zone of the first conduction type, which discharge zone is doped more highly than the drift zone and is directly adjacent to the compensation zone.

3. The semiconductor component of claim 2, comprising wherein the discharge zone is arranged between the compensation zone and the drift zone.

4. The semiconductor component of claim 2, comprising wherein the discharge zone is completely surrounded by the compensation zone.

5. The semiconductor component of claim 2, comprising wherein a component zone composed of an electrically conductive material is arranged between the discharge zone and the compensation zone.

6. The semiconductor component of claim 5, comprising wherein the electrically conductive material is a metal or a silicide.

7. The semiconductor component of claim 2, comprising wherein a zone with generation centers, an amorphized or polycrystalline component zone, is arranged between the discharge zone and the compensation zone.

8. The semiconductor component of claim 1, comprising wherein the discharge structure has an amorphized component zone.

9. The semiconductor component of claim 8, comprising wherein the amorphized component zone is completely surrounded by the compensation zone.

10. A semiconductor component comprising:
    a drift zone of a first conduction type;
    at least one compensation zone of a second conduction type, complementary to the first conduction type, the at least one compensation zone being arranged in the drift zone; and
    at least one discharge structure which is arranged between the at least one compensation zone and a section of the drift zone that surrounds the compensation zone or in the compensation zone and which is designed to enable a charge carrier exchange between the compensation zone and the drift zone if a potential difference between an electrical potential of the compensation zone and an electrical potential of the section of the drift zone that surrounds the compensation zone is greater than a threshold value predetermined by the construction and/or the positioning of the discharge structure;
    a first component zone, which is adjacent to the drift zone and which together with the drift zone forms a component junction proceeding from which a space charge zone propagates in the drift zone when a component is driven in the off-state; and
    a second component zone, which is adjacent to the drift zone at a side remote from the first component zone.

11. The semiconductor component of claim 10, comprising wherein the discharge structure is arranged between the compensation zone and the drift zone at an end of the compensation zone that faces the first component zone.

12. The semiconductor component of claim 10, comprising wherein the discharge structure is arranged within the compensation zone nearer to an end of the compensation zone that faces the first component zone than to an end that faces the second component zone.

13. The semiconductor component of claim 10, comprising wherein the first component zone is a semiconductor zone of the second conduction type and forms a body zone,
    wherein the second component zone is a semiconductor zone of the first or second conduction type and forms a drain zone, and which furthermore comprises:
    a source zone of the first conduction type, which is separated from the drift zone by the body zone; and
    a gate electrode, which is arranged adjacent to the body zone and which is dielectrically insulated from the body zone by a gate dielectric.

14. The semiconductor component of claim 10, comprising wherein the first component zone is a semiconductor zone of the second conduction type.

15. The semiconductor component of claim 10, comprising wherein the first component zone is a Schottky metal zone.

16. The semiconductor component of claim 10, comprising wherein a plurality of compensation zones each having a discharge structure are arranged in the drift zone.

17. The semiconductor component of claim 10, comprising wherein the threshold value is approximately zero.

18. A semiconductor component comprising:
    a drift zone of a first conduction type;
    at least one compensation zone of a second conduction type, complementary to the first conduction type, the at least one compensation zone being arranged in the drift zone; and
    at least one discharge structure which is arranged between the at least one compensation zone and a section of the drift zone adjacent the compensation zone in the compensation zone and configured to enable a charge carrier exchange between the compensation zone and the drift zone if a potential difference between the compensation zone and the drift zone.

19. The semiconductor component of claim 18, comprising wherein the discharge structure has a discharge zone doped more highly than the drift zone, and directly adjacent to the compensation zone.

20. A semiconductor component comprising:
a drift zone of a first conduction type;
means for providing at least one compensation zone of a second conduction type, complementary to the first conduction type, the at least one compensation zone means being arranged in the drift zone; and
means for providing at least one discharge structure which is arranged between the at least one compensation zone and a section of the drift zone that surrounds the compensation zone or in the compensation zone and configured to enable a charge carrier exchange between the compensation zone and the drift zone if a potential difference between an electrical potential of the compensation zone and an electrical potential of the section of the drift zone that surrounds the compensation zone is greater than a threshold value predetermined by the construction and/or the positioning of the discharge structure means.

21. A method comprising:
providing a drift zone of a first conduction type;
forming at least one compensation zone of a second conduction type, complementary to the first conduction type, the at least one compensation zone being arranged in the drift zone; and
forming at least one discharge structure which is arranged between the at least one compensation zone and a section of the drift zone that surrounds the compensation zone or in the compensation zone and which is designed to enable a charge carrier exchange between the compensation zone and the drift zone if a potential difference between an electrical potential of the compensation zone and an electrical potential of the section of the drift zone that surrounds the compensation zone is greater than a threshold value predetermined by the construction and/or the positioning of the discharge structure.

22. The method of claim 21, wherein the discharge structure has a discharge zone of the first conduction type, comprising doping the discharge zone more highly than the drift zone directly adjacent to the compensation zone.

23. The method of claim 21, comprising arranging the discharge zone between the compensation zone and the drift zone.

24. The method of claim 21, comprising completely surrounding the discharge zone by the compensation zone.

25. The semiconductor component of claim 21, comprising arranging a component zone composed of an electrically conductive material between the discharge zone and the compensation zone.

* * * * *